United States Patent [19]

Frantz et al.

[11] 4,188,626
[45] Feb. 12, 1980

[54] METHOD FOR SCANNING A KEYBOARD AND FOR ACTUATING A DISPLAY DEVICE VIA COMMON CONDUCTORS

[75] Inventors: Gene A. Frantz, Irving; George L. Brantingham, Plano, both of Tex.

[73] Assignee: Texas Instruments Incorporated, Dallas, Tex.

[21] Appl. No.: 799,807

[22] Filed: May 23, 1977

[51] Int. Cl.² ............................................. G06F 3/14
[52] U.S. Cl. .................................. 340/711; 340/756; 340/805; 340/365 S; 350/330
[58] Field of Search ............. 340/336, 324 R, 324 M, 340/378 R, 365 R, 365 S, 711, 712, 756, 765, 805; 350/160 LC, 330

[56] References Cited
U.S. PATENT DOCUMENTS

| | | | |
|---|---|---|---|
| 3,950,743 | 4/1976 | Hatano et al. | 340/365 R |
| 3,973,253 | 8/1976 | Criscimagna et al. | 340/324 M |
| 3,990,070 | 11/1976 | Spence | 340/324 M |
| 4,005,403 | 1/1977 | Washizuka et al. | 340/324 M |

Primary Examiner—Marshall M. Curtis
Attorney, Agent, or Firm—Jeffrey Van Myers; Stephen S. Sadacca; Melvin Sharp

[57] ABSTRACT

A circuit and method for actuating a display, especially a liquid crystal display, and a keyboard using a common set of conductors. The circuit includes circuits for generating appropriate display potentials, scanning pulses and sensing the scanning pulses. Certain of the display potentials applied to the display device are also applied to the keyboard. Certain of these potentials applied to the keyboard also have a scanning pulse superimposed thereon. Circuits for sensing the scanning pulses are associated with the circuits which generate the other potentials applied to the keyboard; these other potentials preferably float during the generation of the scanning pulses.

By using the disclosed circuit, a calculator chip for actuating a multi-character position liquid crystal display and for scanning a keyboard may be packaged in a conventional twenty-eight pin package. By appropriately controlling the circuit, a keyboard can be scanned with negligible effect on the liquid crystal display device.

6 Claims, 20 Drawing Figures

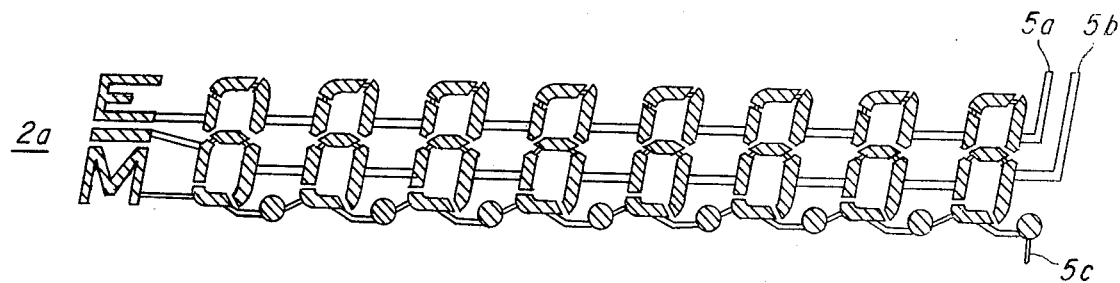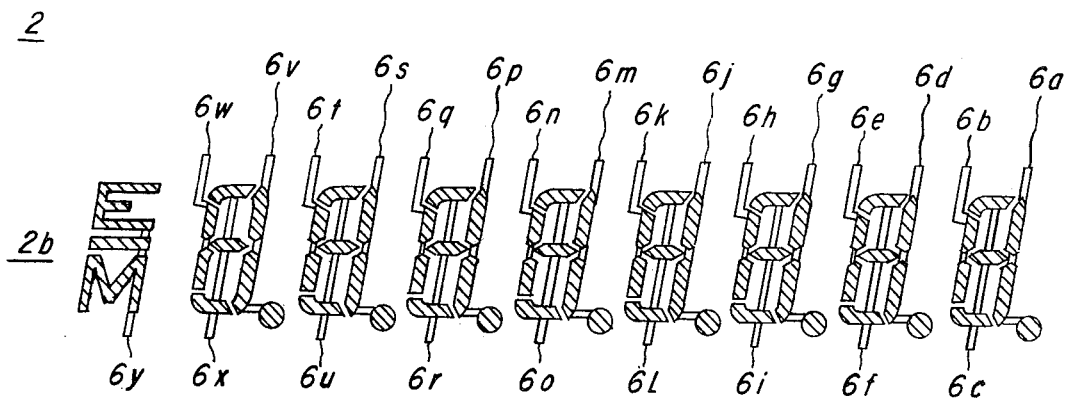
Fig. 1 PRIOR ART
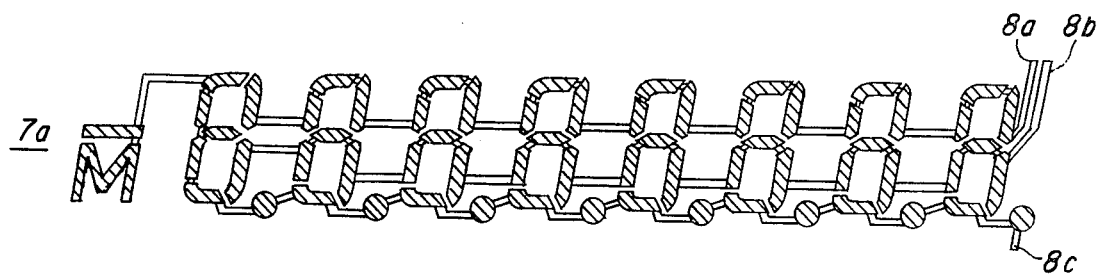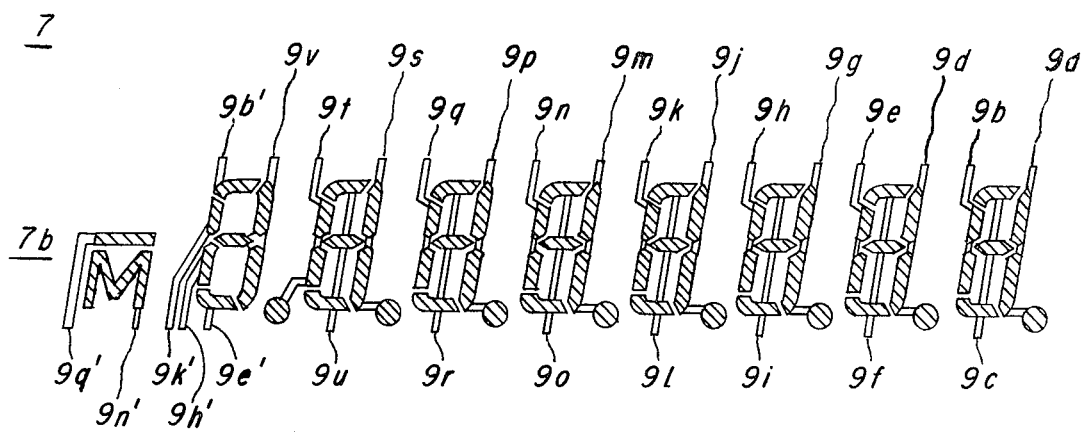
Fig. 3a

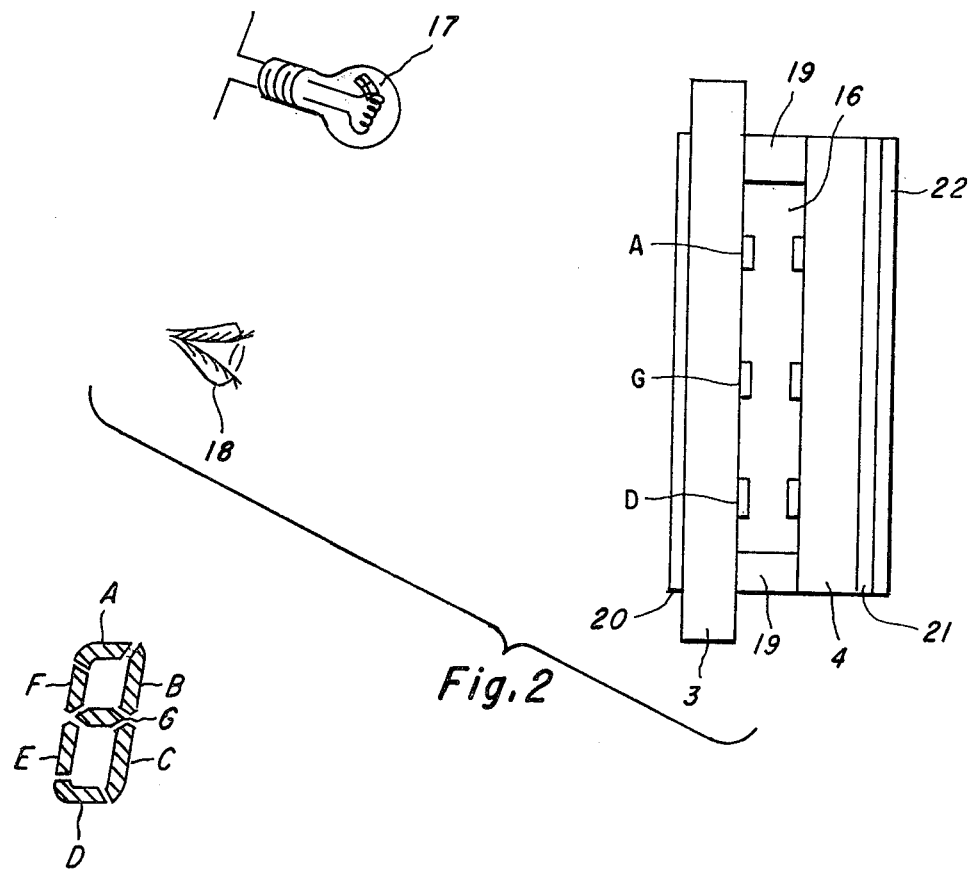
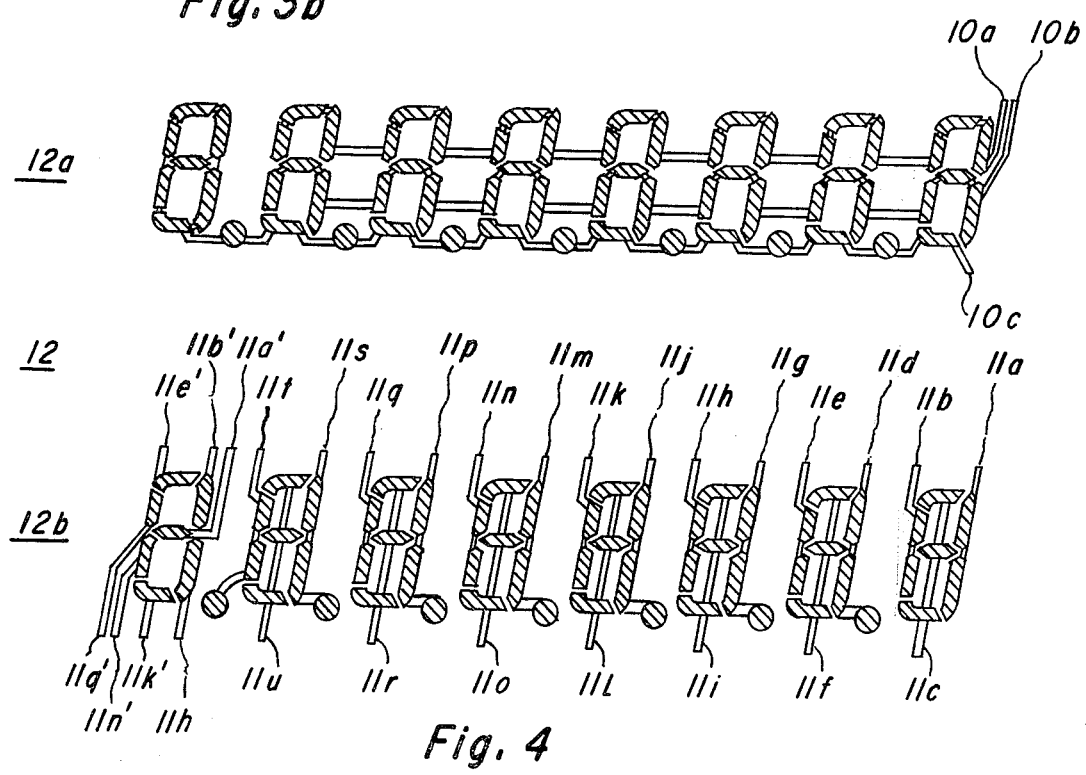
Fig. 2
Fig. 3b
Fig. 4

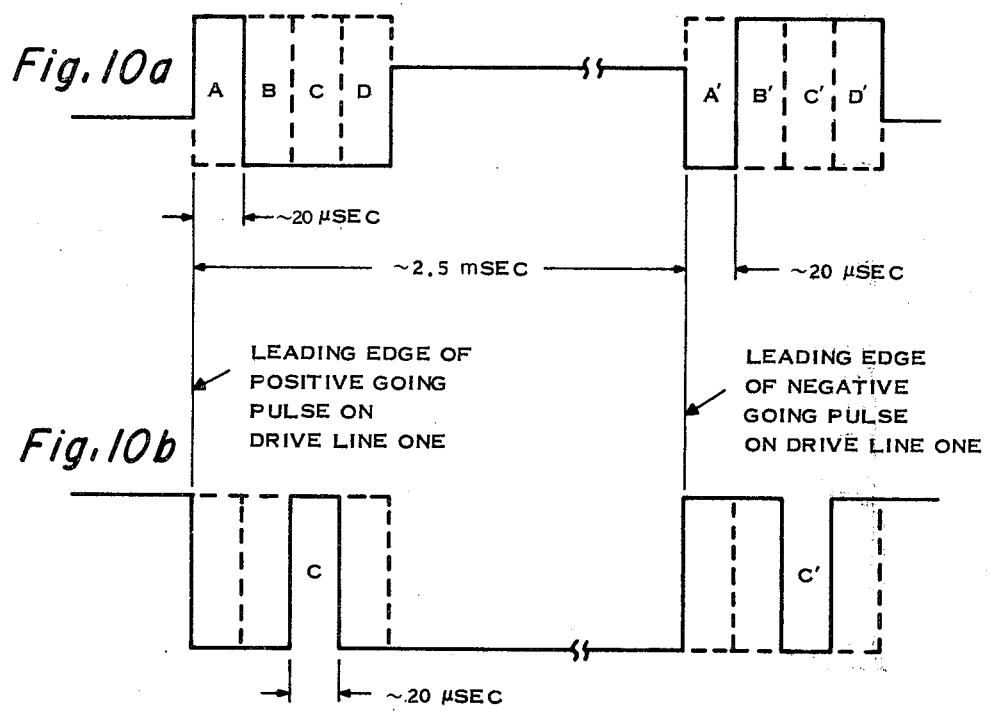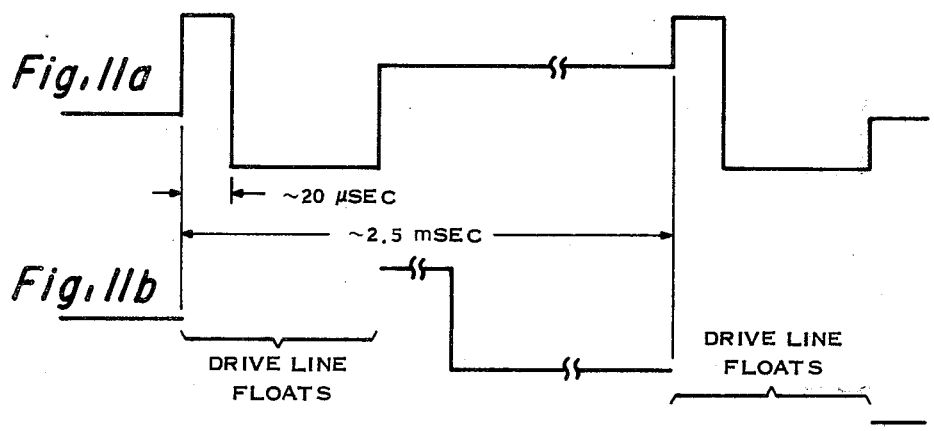

METHOD FOR SCANNING A KEYBOARD AND FOR ACTUATING A DISPLAY DEVICE VIA COMMON CONDUCTORS

BACKGROUND OF THE INVENTION

This invention relates to a circuit for scanning a keyboard and for actuating a display device, particularly a liquid crystal display device.

A type of visual display device coming into popular use incorporates so-called liquid crystals. Such devices are often used in conjunction with a keyboard and a microprocessor or microprocessor type device (such as a calculator chip). In the prior art, other types of display devices including arrays of light emitting diodes and vacuum flourescent devices have been used in conjunction with such microprocessor and microprocessor type devices. Further, in the prior art, it has been known to strobe the keyboard using lines which are also used for strobing an array of light emitting diodes, for instance. For example, a calculator utilizing a display drive and keyboard scan technique whereby a portion of the keyboard lines are interconnected with a portion of the display lines is disclosed in U.S. Pat. No. 3,984,816 for an "Expandable Function Electronic Calculator," which issued Oct. 5, 1976 and is assigned to the assignee of this invention. Such techniques were employed to reduce the number of pins on the calculator chip, to reduce the cost of packaging the calculator chip and to reduce the cost of manufacturing a calculator using the chip.

For various reasons, such prior art techniques have not been found to be applicable to devices utilizing Liquid Crystal Display (LCD) devices. For instance, the displays comprised of arrays of light emitting diodes can be operated on as little as a 1/15 duty cycle. In contradistinction, the lowest duty cycle currently available for a liquid crystal display having acceptable contrast levels (e.g. twisted nematic liquid crystal displays) is generally believed to be a ⅛ duty cycle. It should be evident to those skilled in the art that as the duty cycle of the device decreases, the number of pins required to interconnect the display device with a microprocessor or microprocessor type device increases. Further, because of the nature of the preferably Alternating Current (A.C.) signals applied to the segment lines and drive lines of a liquid crystal display device, this tends to complicate sensing techniques for sensing a key-down at the keyboard if either of these lines are used to drive the keyboard. As a consequence of the foregoing, prior art microprocessor type chips adapted for use with LCDs have been packaged in forty or forty-two pin packages. The display pin-out for such chips required on the order of twenty-eight pins, and the keyboard required on the order of ten pins plus battery connections and so forth resulted in such comparatively large pin-outs. On the other hand, calculator chips in twenty-eight pin packages are well known for displays utilizing light emitting diodes. It is often preferable, however, because of the lower current requirements of liquid crystal displays compared to light emitting diode displays, that liquid crystal displays be used in modern calculators to prolong the battery life of such calculators.

It was on object of this invention that a microprocessor type chip be packaged in a standard twenty-eight pin package and be interconnectable with a source of power, a keyboard, and a liquid crystal display.

It is another object of this invention that a calculator chip be interconnected with a matrix keyboard and a liquid crystal display device using a small number of interconnections.

It is still yet another object of this invention that a calculator chip be interconnected with a liquid crystal display device by a plurality of interconnections and that selected ones of said plurality also be used to interconnect a matrix keyboard with the calculator chip.

The foregoing objects are achieved as is now described. In a preferred embodiment of the invention, a calculator chip is interconnected with a liquid crystal display device via a plurality of conductors, the chip including display actuation circuits for providing normal four or five voltage level actuation signals to the LCD via these conductors. A matrix keyboard is provided which has two sets of conductors, these sets being coupled to the aforementioned plurality of conductors. Keyboard scanning signals or pulses are superimposed on the display actuation signals being supplied to those conductors coupled to the LCD and to one set of the keyboard conductors. These scanning signals or pulses preferably occur in time relation to signals occuring upon one of the display drive line conductors, preferably add no or little DC component to the display actuation signals and preferably have an RMS value small in comparison to the RMS value of the actuation signals. The display actuation circuits coupled to the other set of keyboard conductors are arranged to permit their outputs to float during the times the keyboard scanning signals or pulses are being supplied to the one set of keyboard conductors and are also coupled to sensing circuits for detecting such keyboard scanning signals or pulses, thereby indicating that a switch on the matrix keyboard has been closed. Based on the time a scanning signal or pulse is detected by the sensing circuit and depending upon which conductor of the other set of conductors a scanning signal or pulse is sensed, the particular switch closed on the matrix keyboard may be determined.

It should become evident that while this invention is preferably practiced with a liquid crystal display device, the basic technique herein disclosed may be used with other type display devices as well as liquid crystal displays.

BRIEF DESCRIPTION OF THE DRAWINGS

The novel features believed characteristic of the invention are set forth in the appended claims. The invention itself, however, as well as a preferred mode of use, further objects and advantages thereof, will be best understood by reference to the following detailed description of illustrative embodiments thereof when read in conjunction with the accompanying drawings, wherein:

FIG. 1 depicts in representative form a segment forming conductor pattern used on a prior art liquid crystal display;

FIG. 2 is a sectional view through a liquid crystal display adapted for using twisted nematic liquid crystal material;

FIG. 3a depicts one embodiment of a segment forming conductor pattern for use with a chip having reduced pin-out requirements;

FIG. 3b defines the various segments of a character;

FIG. 4 depicts another embodiment of a segment forming conductor pattern;

FIGS. 10a–10b show the potentials of FIG. 9 in greater detail; and

FIGS. 11a–11b depict another embodiment of the segment, drive line and scanning potentials for a four voltage level LCD display system.

DETAILED DESCRIPTION

Figure 5:
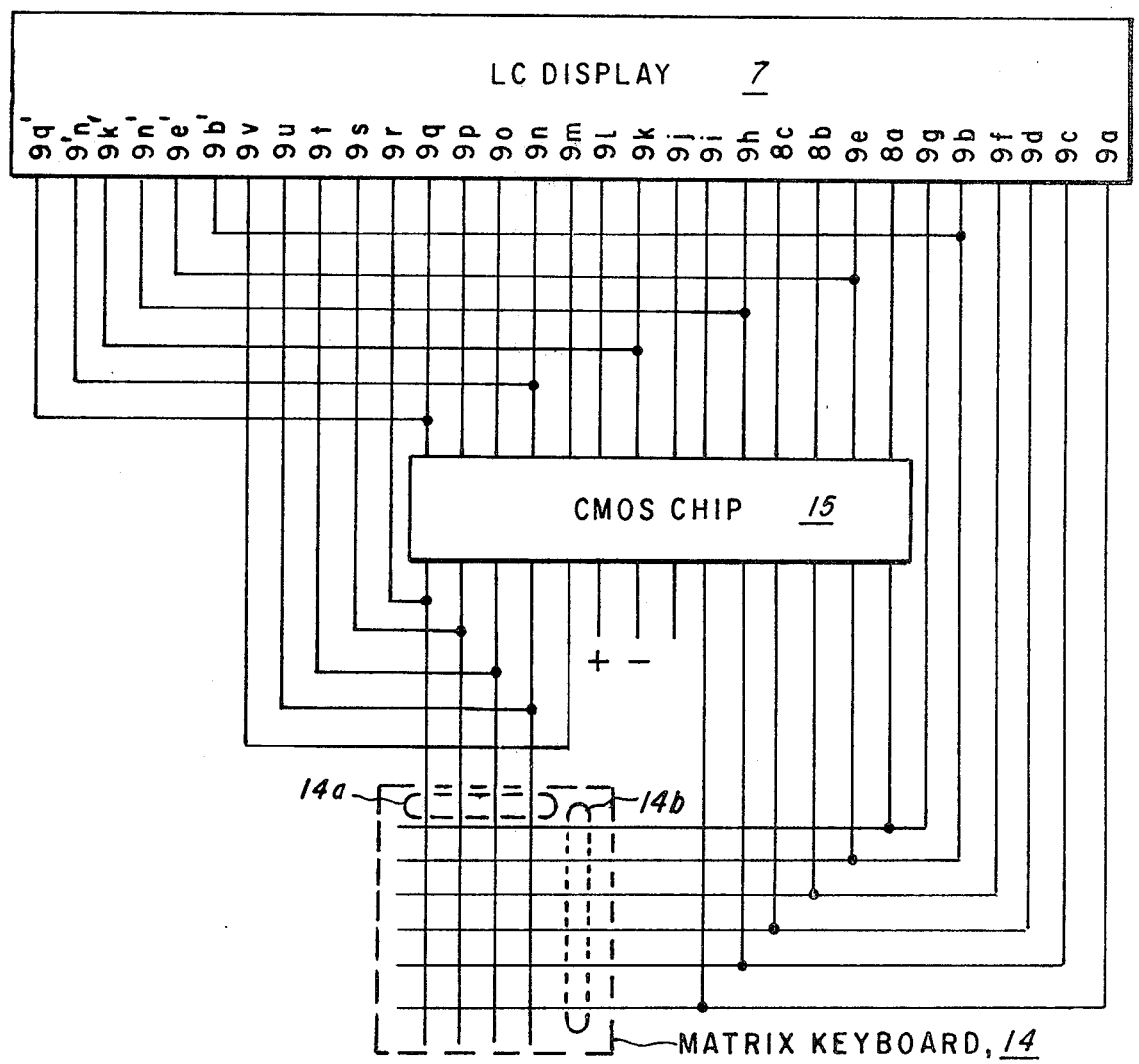
FIG. 5 is a diagram of a chip with reduced pin-out requirements interconnected with a LCD and a keyboard.

Referring now to FIG. 1, there is shown, in representative form conductors forming pattern 2a and 2b deposited on the top and bottom substrates and 3 and 4 (FIG. 2) of a Liquid Crystal Display (LCD) device 2 of the type heretofore known. The portions of the conductors forming character segment electrodes are shown with diagonal lines, while those portions which are to interconnect the character segments are shown without such diagonal lines. It should be remembered, of course, that the conductors are preferably transparent and the segment portions of the electrodes are shown here with diagonal lines merely for the sake of clarity. It is to be appreciated that the conductor patterns 2a and 2b are deposited on transparent substrates, 3 and 4 (FIG. 2) such as glass, which substrates are sandwiched together and the region between substrates filled with a nematic liquid crystal. Of course, the conductor patterns 2a and 2b deposited on the substrates are in contact with the nematic liquid crystal, which is sealed between the substrates by a boundary of epoxy cement or other sealing means. It should be evident to those skilled in the art, that LCD 2 formed by the conductor patterns 2a and 2b is a one-third duty cycle display; that is, any segment of a character thereof is actuated by electrical signals only one-third of the time. However, given the time response of liquid crystals, a one-third duty cycle display appears to be constantly actuated to the human eye.

AC signals are preferably sequentially supplied to drive lines 5a, 5b, and 5c while AC signals are also selectively applied to segment lines 6a–6y. Thus, to form the character "3" in the least significant digit position, for instance, segment lines 6a and 6c would be actuated when drive line 5a is actuated, segment lines 6a and 6c would then be actuated when drive line 5b is actuated and finally segment line 6c would be actuated when drive line 5c is actuated; this sequence is then repeated, the period thereof being approximately 7.5 msec. As can be seen, this sequence of select line actuation actuates segments A and B for one-third of the time, C and G for another third of the time and D for another third of the time, the segments being identified according to FIG. 3b. As can be further seen from FIG. 1, a display utilizing this prior art conductor layout requires three separate drive lines 5a–c and twenty-five separate segment lines 6a–6y. Considering that a calculator chip driving display 2 would also require at least two power supply connections, it can immediately be seen that such a chip cannot be mounted in a twenty-eight pin package and also drive the display 2. Further, since in the prior art, separate keyboard lines were used to interface the calculator chip with a keyboard 14 (FIG. 5), chips for calculators having liquid crystal displays are being disposed in packages having forty or more pins.

The one-third duty cycle display of FIG. 1 is commonly used with liquid crystals operated in the twisted nematic mode. The present invention is directed to display system operated on low duty cycles, such as the twisted nematic LCD, but it should soon be evident to those skilled in the art that the present invention is not limited to twisted nematic LCD's, but is preferably utilized with displays generally having low duty cycle characteristics.

Referring now briefly to FIG. 2, there is shown a sectional view of a twisted nematic type liquid crystal display 2. The liquid crystal display 2 comprises a front plate or substrate 3 and a back plate or substrate 4 separated by a spacing layer and sealing means 19 forming an enclosed cavity for liquid crystal material 16 between the front and back plates. Conductor segments A, G and D, as identified in FIG. 3b, are shown in FIG. 2. A light source 17 provides light for the display 2. A viewer of the display 2 is generally identified by numeral 18. A first light polarizing media 20, commonly referred to as an analyzer is disposed between viewer 18 and liquid crystal 16. A second light polarizing media 21, commonly referred to as a polarizer, is disposed between liquid crystal 16 and a reflective medium 22, which is generally attached to the rear of the display.

Although various types of liquid crystals may be utilized in forming the liquid crystal display 2, nematic liquid crystals have generally been used. Inasmuch as specific examples of nematic liquid crystals are known to persons skilled in the art, such liquid crystals are not described in detail herein.

The front and back plates 3 and 4 of the liquid crystal display 2 are generally disposed in parallel and separated by a spacer 19 which serves to seal the liquid crystal material between the front and back plates 3 and 4, respectively. The separation of the plates 3 and 4 depends upon the particular liquid crystal material utilized and the voltage levels used to strobe the segment elements; however, separations on the order of five to seventy-five microns are known and voltages as low as three to four volts are known. The conductors are preferably transparent; tin oxide may be used for the conductor material.

When operated with crossed analyzer 20 and polarizer 21 and when no drive and segment voltages are applied to the conductors, light from the light source 17 generally passes through the display 2 and thus a viewer is unable to see any characters. However, when the drive and segment voltages, applied to the conductors are of sufficient magnitude and duration the molecules of the liquid crystal material 16 between opposed segments on the front and rear plates 3 and 4 will align in the homeotropic state. In this state the liquid crystal material 16 disposed between appropriately energized, opposed conductor segments on the front and rear plates 3 and 4, respectively, ceases to rotate the light passing therethrough and the crossed analyzer/polarizer extinguishes the light, causing the energized segments to appear dark to viewer 18.

When operated with parallel arranged analyzer/polarizer, the light and dark areas of the display 2 are reversed. That is, appropriately energized segments appear as light areas on a dark background.

For a further discussion of the operation of twisted nematic and other types of liquid crystal display devices, reference should be made to "Liquid Crystal Displays" by L. S. Goodman in the Journal of Vacuum Science and Technology, Vol. 10, No. 5, September/October 1973.

Referring now to FIG. 3a, there is shown a one-third duty cycle liquid crystal display 7 having conductor patterns 7a and 7b, which, as will be seen, requires only twenty-five interconnections with a calculator chip. Subsequently, a method for inputting data at a matrix keyboard 14 (FIG. 5) using the display select lines will be explained. The chip 15 driving display 7 may, as will be seen (FIG. 5), be easily disposed in a standard integrated circuit package having twenty-eight pins. Conductor pattern 7a is coupled to three drive lines 8a–8c. Drive line 8a is coupled to the A, B, and F segments of all character positions, except for the most significant character position where it is coupled to the B segment. Again, the segment positions are identified in FIG. 3b. Drive line 8b is coupled to the C, E, and G segments in all character positions except for the most significant character position where it is coupled to the C segment thereof. Drive line 8c is coupled to the decimal point segments; the D segments in all character positions; the A, E, F, and G segments of the most significant character; the minus sign segment and the memory indicator segment. Segment lines 9a, 9d, 9j, 9m, 9p, 9s, and 9v are coupled to respective B, C, and decimal point segments in each character position, except for select line 9v which is coupled to segment G of the most significant character is lieu of a decimal point segment. Segment lines 9c, 9f, 9i, 9l, 9o, 9r, and 9u are coupled to respective A, D and G segments for all character positions save the most significant character position. The segment lines 9b, 9e, 9h, 9k, 9n, 9q, and 9t are coupled to respective E and F segments for each character position, except the most significant character position; segment line 9t is also coupled to the decimal point segment for the most significant character. Segment lines 9b', 9e', 9h', 9n' and 9q' are respectively coupled to the A, D, E and F segments of the most significant character, the memory indicator segment and minus sign segment. As can be seen from FIG. 5, segment lines 9b', 9e', 9h', 9k', 9n', and 9q' are respectively connected in common with segment lines 9b, 9e, 9h, 9k, 9n, and 9q. This interconnection may be affected within display 7 or external to display 7 as is shown in FIG. 5, as a matter of a design choice.

Thus, display 7 requires only three drive lines 8a–8c and twenty-two segment lines 9a–9v to provide an eight character position display ith decimal points, minus sign and memory indicators. Inasmuch as each character and decimal point therefor comprise eight segments, plus two segments for the minus sign and memory indicator, a total of sixty-six segments fully populates this three by twenty-two multiplexing scheme. As can be seen from FIG. 3a, the error indicator has been eliminated in this embodiment; however, error indication may be provided by calculator chip 15 by flashing display 7, for example, during an error condition. Alternatively, it should be evident to those skilled in the art that the memory indicator or decimal point segment for the least significant digit position could be exchanged for an error indicator segment.

Referring now to FIG. 4, there is shown another embodiment of a one-third duty cycle LCD. This LCD 12 has eight character positions with no error, minus sign, memory indicator or decimal point indicator for the least significant digit position. Drive lines 10a–10c are connected to the character segments in much the same manner as drive lines 8a–8c in FIG. 3a except that all the segments of the most significant character position are connected to drive line 10c. Similarly, segment lines 11a–11t are connected in the same manner as segment lines 9a–9t in FIG. 2, except that segment lines 11a', 11b', 11e', 11h', 11k', 11n', and 11g' are connected to the G, B, A, C, D, E and F segments of the most significant character. The segment lines with primes are again connected to their unprimed counterparts. As can be seen, display 12 is a one-third duty cycle liquid crystal display having three drive lines 10a–10c and twenty-one select lines 11a–11t for providing a fully populated sixty-three segment display using a three by twenty-one multiplexing technique. For this type of eight character display, negative numbers are limited to seven digit positions with the G segment of the most significant character position being used for a minus sign indicator.

Referring now to FIG. 5, there is shown a simplified schematic drawing of a calculator chip 15 for driving the liquid crystal display 7 of FIG. 2, calculator chip 15 being interconnected with a matrix type keyboard 14. As can be seen, chip 15 is provided in a standard twenty-eight pin integrated circuit package, twenty-five pins interconnecting with liquid crystal display 7 and matrix keyboard 14, two pins being provided for power connections and another pin being unused in this embodiment. As can be seen, matrix keyboard 14 is interconnected with selected select lines 9a–9v for scanning or strobing the column conductors 14a row conductors 14b of matrix keyboard 14. Of course, the particular segment lines used as well as the number of keyboard positions provided in matrix keyboard 14 utilized is also a design choice; however, a matrix keyboard which is both inexpensive to manufacture and which may be used in the practice of this invention is disclosed in U.S. Pat. No. 4,005,293, which issued Jan. 25, 1977 and which is assigned to the assignee of this invention.

Preferably, calculator chip 15 includes a single integrated circuit upon which the circuits for generating the hereinafter described drive potentials, normal segment potentials and scanning segment potentials are integrated.

Figure 6:
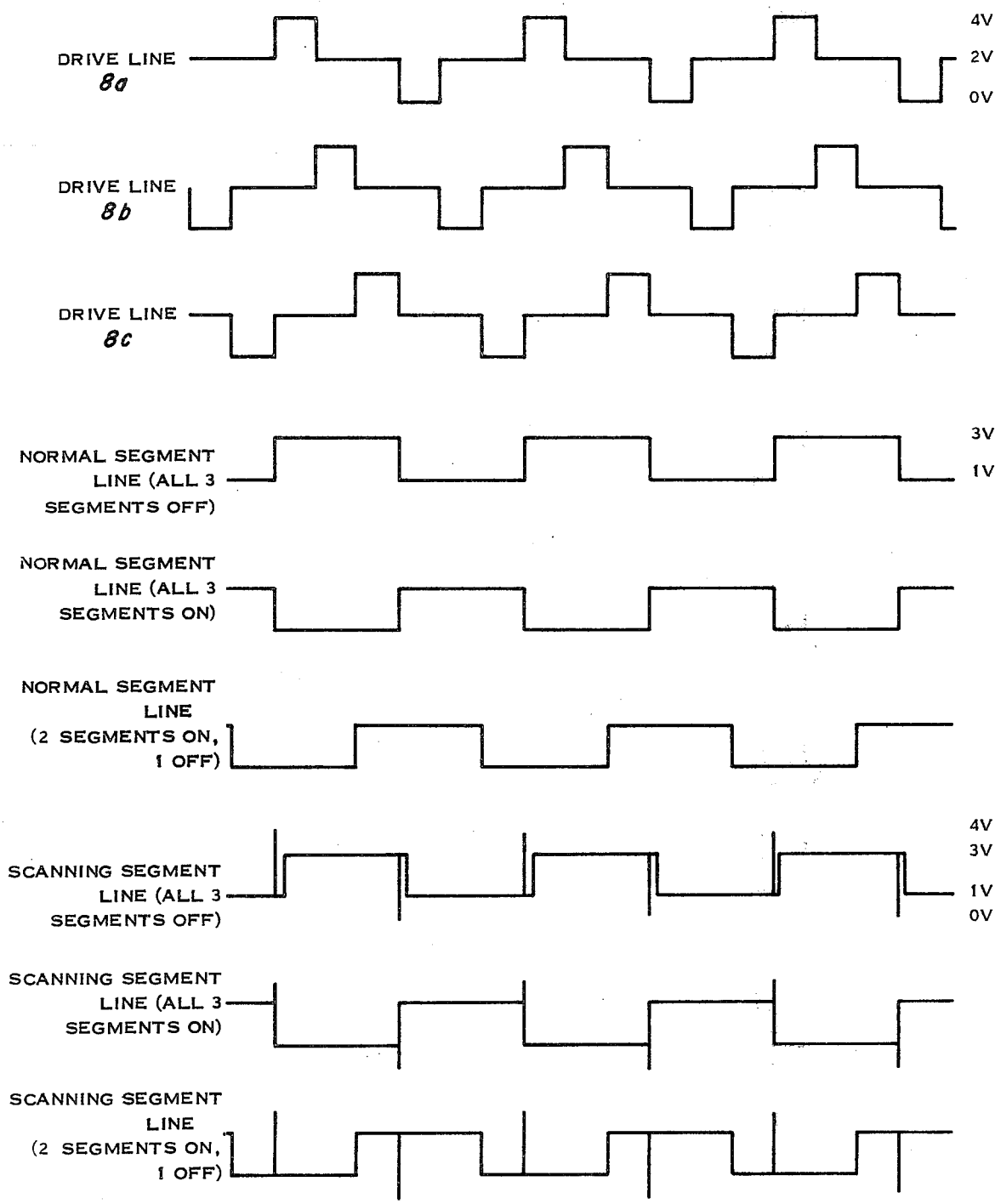
FIG. 6 shows the segment, drive line and scanning potentials for a five voltage level LCD display system.

Referring now to the upper portion of FIG. 6, there is shown voltage potentials on drive lines 8a–8c. Also, the voltage on a normal segment line when (1) three segments are off, (2) three segments are on and (3) two segments are on and one segment is off are also depicted. These segment line voltages are referred to as "normal" to differentiate them from the scanning segment lines used to scan matrix keyboard 14, which are explained below. As can be seen, the normal segment line (all three segments off) is in phase with the positive and negative going pulses on the three drive lines 8a–8c. It should be evident to those skilled in the art, that the D.C. component on any segment is zero and that the R.M.S. value of the A.C. component on any segment is not sufficient to actuate that segment. The next normal segment line (all three segments on) is, of course, out of phase with the pulses on the drive lines, thereby increasing the R.M.S. value of the A.C. voltage supplied to each segment to a level sufficient to actuate those segments. Again, the D.C. component is zero. The third normal segment line (two segments on, one segment off) is shown as being in phase with drive line 8c and out of phase with drive lines 8a and 8b whereby the R.M.S. value of the A.C. voltage applied to the segments associated with drive lines 8a and 8b is of sufficient level to actuate those segments while the R.M.S. value of the A.C. voltage supplied to the segment associated with the drive line 8c is insufficient to actuate that segment. Now, for example, if the drive lines voltage as shown in FIG. 6 were applied to display 7 (FIG. 3a) and the "all segments off" segment line voltage were applied to segment line 9b, the "all segments on" voltage were applied to segment line 9c and the "two segments on, one segment off" voltage applied to segment line 9a, the number "3" (with no decimal point) would appear in the least significant digit position of display 7. Based on the foregoing discussion, it will be evident how the select lines 9a–9v of display 7 are selectively energized with A.C. signals to actuate the various segments in display 7 to communicate desired information to the viewer thereof.

It will be evident to those skilled in the art that the aforementioned system for actuating an LCD is the so-called five voltage level system; that is, the drive lines and segment lines produce the following potentials, where V is equal to 1.0 to 1.4 volts or more depending upon the LCD requirements: 0 v, 1 v, 3 v, and 4 v.

Having explained how display 7 may be normally actuated, it will now be explained how the segment lines may be used for the purpose of strobing or scanning keyboard 14 without hindering display operation. It has been found that because of the response characteristics of liquid crystal displays, short duration, periodic, high frequency bursts of data may be superimposed on either the display drive or select lines without effecting the information displayed. In order to minimize any effect on displayed information, the following restraints are preferably imposed upon such a burst data system:

(1) the data bursts should preferably add no D.C. component to the signals appearing across the segments;

(2) the R.M.S. component of the burst signal should be preferably small in comparison to the R.M.S. component of signals actuating that display; and (3) the display should be preferably blanked when the actuation of a key is detected.

These constraints are preferably imposed for the following reasons, it being understood that the keyboard scanning system to be explained is operable even if such constraints are not observed:

(1) DC components tend to shorten display life, (2) as the R.M.S. components of the burst signal increase compared to the R.M.S. components of an actuation signal, the contrast ratio of the displayed data is adversely affected; and (3) if the display is not blanked, the coupling of two segment lines during the actuation of a key at the keyboard will tend to cause the observance of undesired character patterns at the display.

Referring again to FIG. 6, at the lower portion thereof, representations of the voltages on scanning segment lines are shown for the same three cases as is depicted for normal segment lines, that is, (1) all segments off, (2) all segments on, and (3) two segments on, one segment off. In this embodiment of the invention, the burst of data is applied in timed-relation to the pulses on drive line 8a. Here the burst of data is a pulse having a period of approximately 20 microseconds and occurring in timed relation to the leading edge of pulses on drive line 8a. In the embodiment depicted in FIG. 6, these pulses are shown occurring at approximately the same instance as the occurrence of a leading edge on drive line 8a. As can be seen, these pulses are preferably added in a positive going direction for a positive going voltage on drive line 8a and in a negative going direction for a negative going voltage on drive line 8a, whereby no D.C. component is added to the voltages sensed by the segments of the display. Further, these pulses are of short duration compared to the drive line pulse whereby the R.M.S. contribution by the pulse is small compared to that of the drive line and segment line voltage for an actuated segment. The burst pulses are shown as occurring in timed-relation to the pulses on a drive line; however, it should be evident to those skilled in the art that the burst pulse could also be generated in timed-relation to the pulses occurring on the segment line (as opposed to the drive line), but it is believed that using the drive line for controlling the occurrence of the pulses on scanning segment lines simplifies the control circuitry needed therefor.

It has been mentioned that the scanning pulses preferably occur in a fixed time relationship with respect to the pulses on drive line 8a. Referring now to FIGS. 7a–7c, FIG. 7a shows a drive line and a scanning segment line (all segments off) as previously shown in FIG. 6. FIGS. 7b and 7c depict the signals on the scanning segment line (all segments off) in greater detail. As can be seen from FIGS. 7b and 7c, the pulse may occur approximately at the leading edge of the drive line pulse (at reference A) or a predetermined time thereafter (at references B, C or D for instance). In practicing the invention, one scanning segment line is provided with the reference A pulse, another with the reference B pulse, another with the reference C pulse and so forth. These different scanning segment lines are then applied to separate column conductors 14a of matrix keyboard 14 (FIG. 5). When a keyboard switch is depressed, the pulse is communicated to a row conductor 14b and depending upon which row conductor the pulse occurs upon and further depending on the timing of the pulse with respect to the leading edge of the pulses on drive line 8a, the particular key depressed is decoded by sensing circuit means on chip 15. To assure that the scanning pulses are not masked from the sensing circuit means by the segment line signals normally occurring on segment lines, the potential on the sensing segment lines is permitted to float during the period that the scanning pulses are being generated on scanning segment lines as depicted in FIG. 7d; that is, the normal segment line voltage is temporarily disconnected during the time that the sensing means must be able to sense the scanning pulses. Also during this time, the sensing segment lines should preferably be coupled to a small load to prevent inadvertent response of the sensing circuit means to circuit noise.

As was previously mentioned, the calculator preferably blanks the display immediately after a key depression is detected so that undesired segments are not actuated in the display during keyboard operations.

Figure 7:
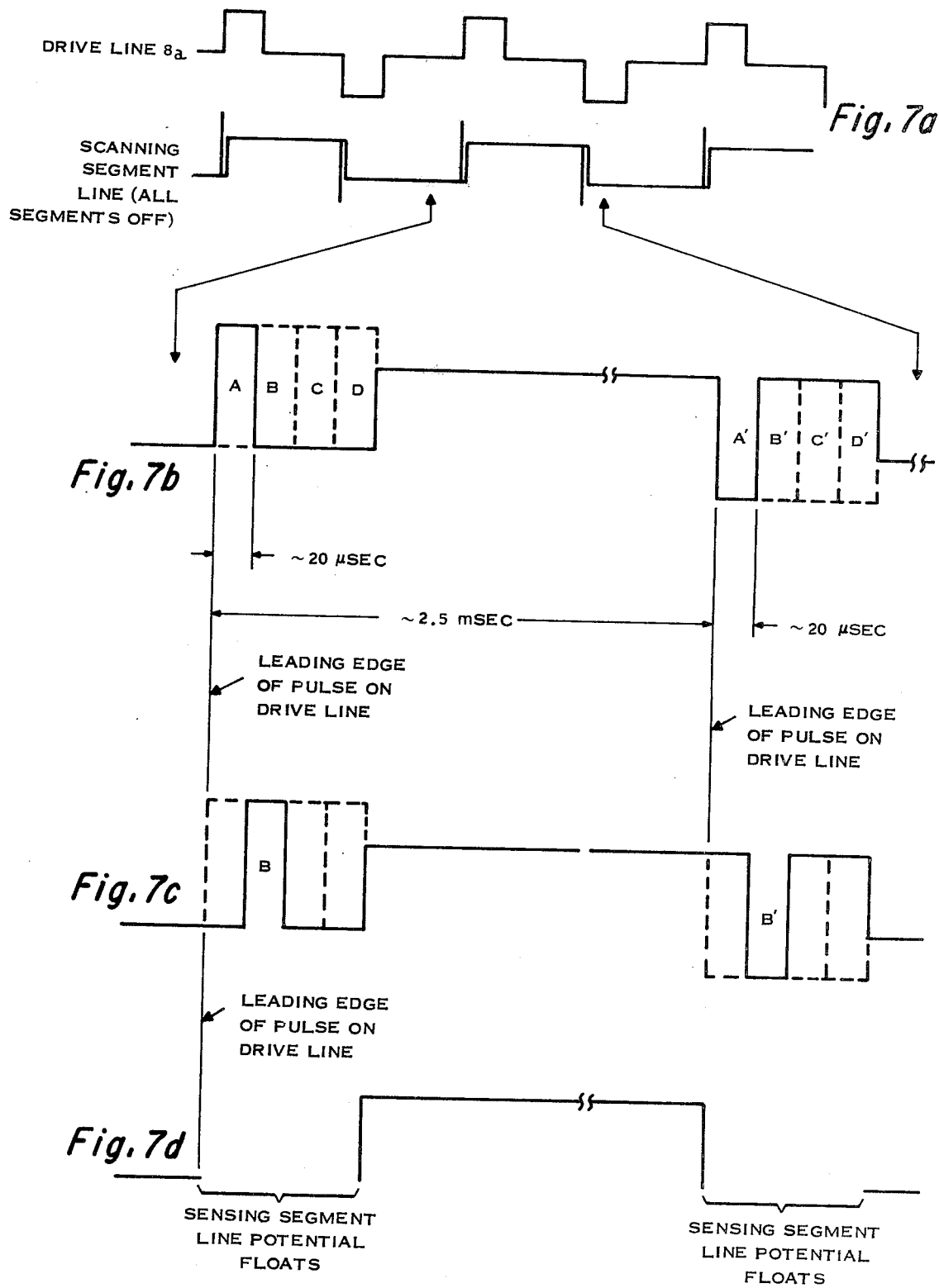
FIGS. 7a–7d show the potentials of FIG. 6 in greater detail.

In the embodiment of FIGS. 6 and 7 positive going pulse A occurs in timed-relation with the leading edge of the pulse on drive line 8a and is of approximately twenty microseconds duration. It is followed by approximately sixty microseconds of voltage at the 1 v potential before returning to the 3 v potential. The height of the scanning pulse is shown as going to the 4 v potential. However, the potential selected is a matter of design choice.

The negative going pulse at A' may or may not be sensed by the circuit means as a matter of design choice; however, it is preferably inserted into the scanning segment line signal along with the pulse at A to eliminate or reduce the D. C. component, for the reasons aforementioned. In FIG. 7c, there is shown a scanning segment line (all segments off) with the scanning pulse occurring at the reference B and B' positions. In FIG. 7d, the eighty microsecond float occurring opposite the reference A, B, C and D and the reference A', B', C' and D' pulses to minimize D. C. voltages at the display segments is shown.

Referring now to FIGS. 8a–8d, there is shown another embodiment of a five voltage level system with scanning pulses. This embodiment differs from the embodiment of FIGS. 6, 7a–7d in that the scanning pulses A-D and A'-D' instead of being of a complementary relationship to minimize D.C. voltages across display segments, are shown here as always being added with the same polarity. Given the display drive line potentials of the embodiment of FIGS. 6, 7a–7d, this would then result in some D. C. being coupled to the display segments. In this embodiment, the display drive line potentials are permitted to float during each approximately 80 microsecond period that scanning pulses are generated to eliminate any D. C. component which would otherwise be contributed.

Figure 8:
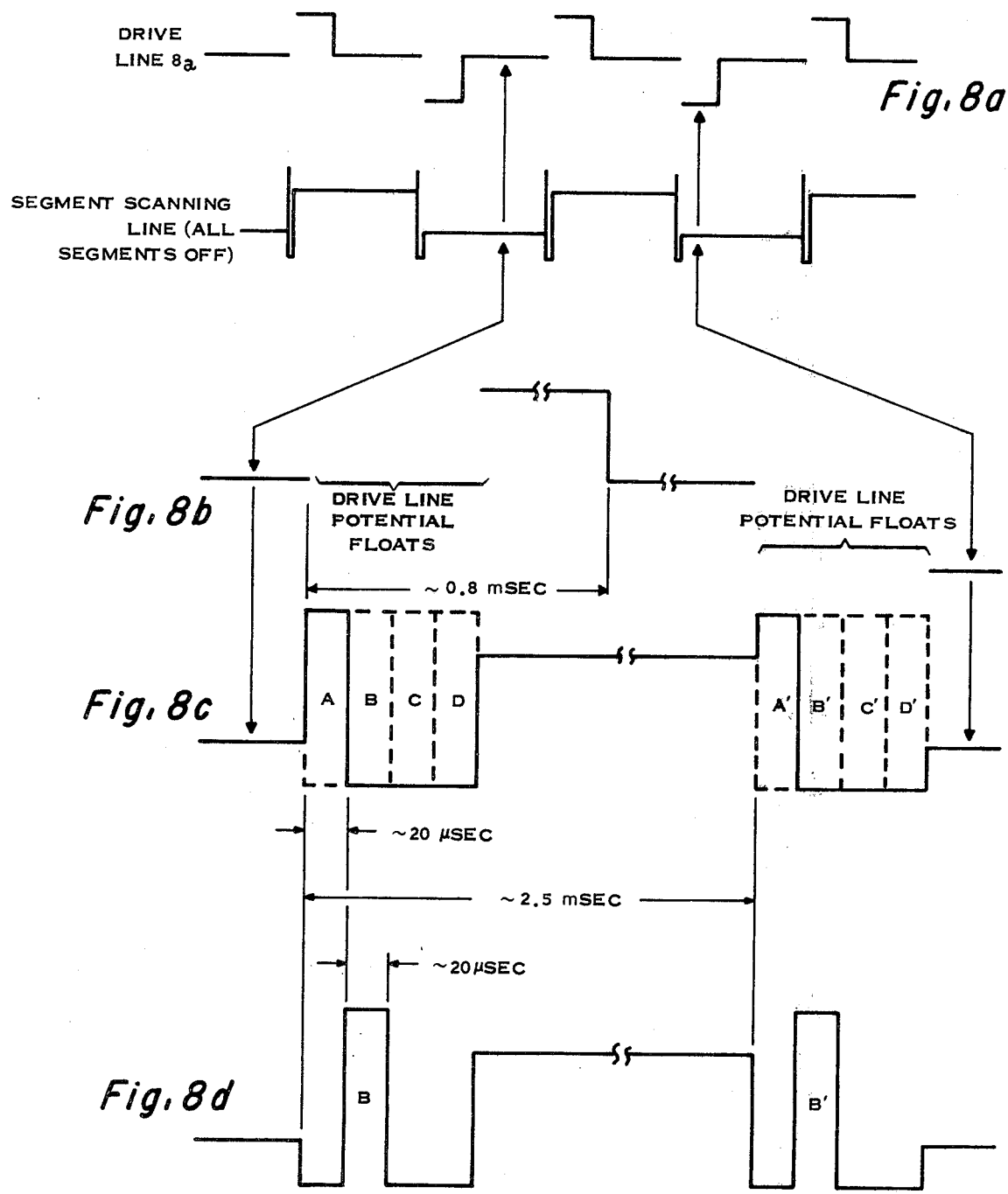
FIGS. 8a–8d depict another embodiment of the segment, drive line and scanning potentials for a five voltage level LCD display system.

The drive line potentials with float during the approximately 80 microsecond periods are shown in FIG. 8b. Segment line potentials for all segment off, with scanning pulses at times A and B, respectively, are shown in FIGS. 8c and 8d.

Figure 9:
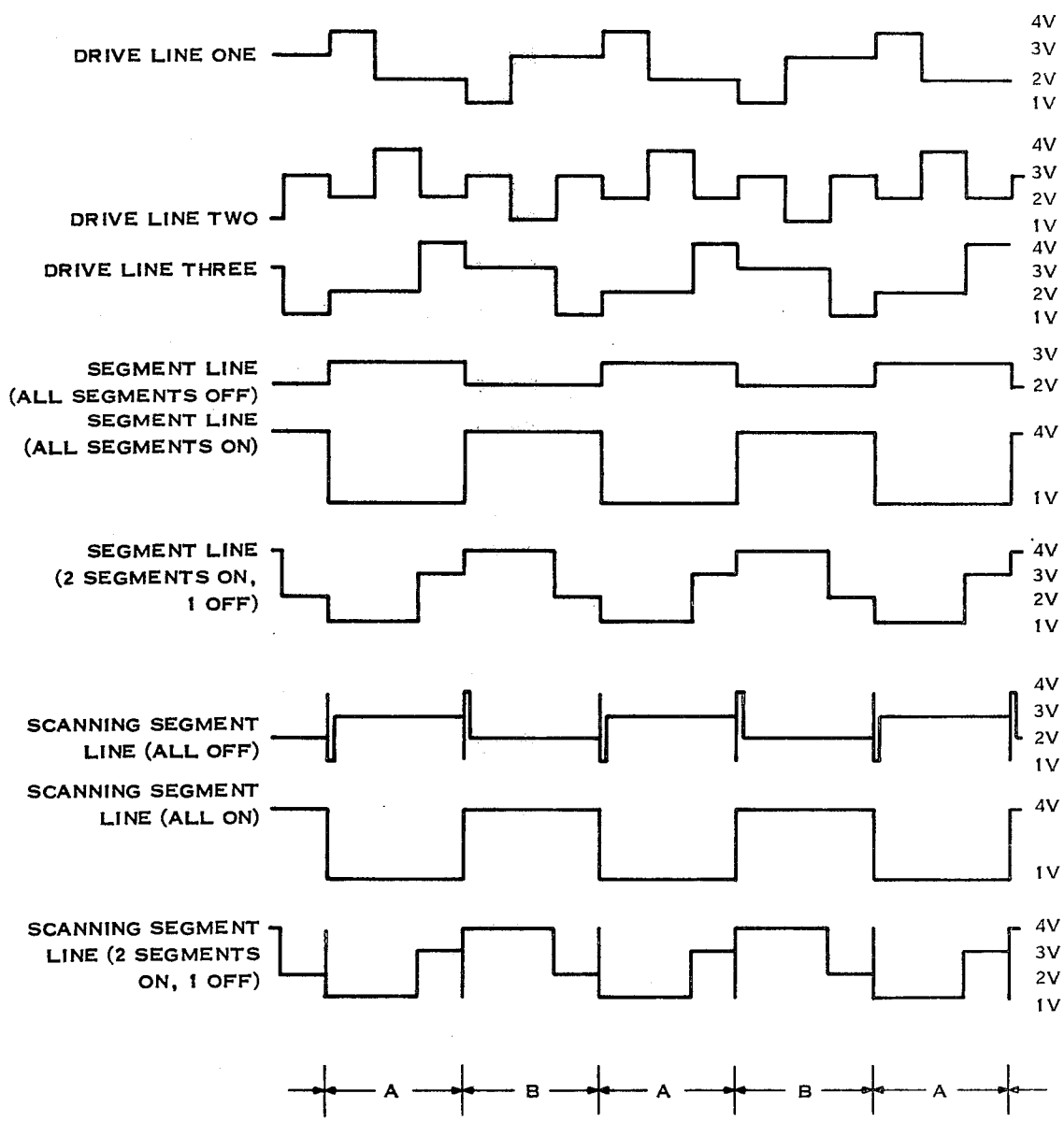
FIG. 9 depicts the segment drive line and scanning potentials for a four voltage level LCD display system.

It will be appreciated that these keyboard scanning techniques are applicable to other liquid crystal display driving techniques as well as the five voltage level system just described. For instance, in FIG. 9, there is shown the potentials on three drive lines and three exemplary segment lines for a four voltage level LCD system. The four voltage level LCD system voltages may be derived from the five level system of FIG. 6, by using the same voltage levels of FIG. 6 for the period that a positive pulse is on any one of the drive lines and by adding a voltage equal to 1 V to all voltage levels during the time that a negative going pulse is one of the drive lines. These two periods are identified by the Reference A's and Reference B's in FIG. 9 for ease of understanding. The data burst, or data pulse of this invention may be applied to the four voltage level system of FIG. 9 in the same general manner as aforementioned. In FIGS. 10a and 10b, as it would occur on a scanning segment line (all segments off) the data burst is shown in greater detail. In FIG. 10a, the data burst A occurs in timed-relation to the leading edge of the signal on drive line one, immediately after the leading edge. In FIG. 10b, the data burst C occurs in timed-relation to the leading edge of the signal on drive line one, approximately 40 μsec or so there after. It will be evident to those skilled in the art how a detailed representation of potentials on scanning segment lines for three segments on; two segments on, one segment off; or one segment on, two segments off would appear.

In FIGS. 11a and 11b there is depicted yet another embodiment. In this embodiment, the scanning pulses on the segment line potential (FIG. 11a) have the same polarity as in FIG. 8a, but with four level logic as in FIG. 9. The drive line potential floats during the approximately eighty microsecond periods that scanning pulses are generated on the segment lines.

In FIGS. 7b–d, 8a–d and 10a–b, it has been suggested that the burst data may occur one of four different times with respect to the leading edge of the positive and negative going pulses on a drive line, the different pulses being identified as A, B, C and D in the aforementioned drawings. It will be evident to those skilled in the art that four different timings of these data pulses were selected inasmuch as four column conductors 14a are depicted in the calculator system of FIG. 5. It will be evident that if three, five or more column conductors were utilized then the number of different timing possibilities for the scanning pulse with respect to the leading edge on the drive line would be modified accordingly and such modification will be evident to those skilled in the art. Further, with respect to keyboard 14 in FIG. 5, it has been suggested that scanning segment lines are attached to the column conductors 14a and that the segment lines coupled to the row conductors 14b are provided with the circuit means for detecting scanning pulses upon closure of a switch at keyboard 14. It will be evident, however, that the scanning segment lines could just as well be applied to row conductors 14b and the circuit means for detecting scanning pulses 10e coupled to column conductors 14a.

Moreover, it will be evident to those skilled in the art that the suggested periods and potentials of the scanning pulses, and the segment line signals are a matter of design choice and that a wide range of periods and potentials will be found to be operable within the scope of this invention.

Still further, it will be evident to those skilled in the art that the suggested layout of the conductor patterns may be varied as a matter of design choice. For instance, in FIGS. 3a and 4, the pattern of the segment line conductors for the most significant character position may be exchanged with the pattern of segment line conductors used in the least significant character position. Other such modification will be evident to those skilled in the art.

The invention is not to be limited to the embodiments disclosed, except as set forth in the appended claims.

What is claimed is:

1. A method for actuating a display device and simultaneously scanning a keyboard, said method comprising the steps of:
 (a) communicating A.C. voltages to the segments of a segmented display device via a set of display conductors, the A.C. voltages being of a greater RMS value for those segments which are being actuated than for those segments which are not being actuated;
 (b) communicating a series of keyboard scanning pulses on a first subset of said display conductors, each of said first subset of said display conductors being coupled to a respective one of the switches of said keyboard; and
 (c) sensing the occurrence of said keyboard scanning pulses on a second subset of said display conductors, each of said second subset of said display conductors being also coupled to a respective one of the switches of said keyboard.

2. The method according to claim 1, wherein the RMS value of said keyboard scanning pulses is much less than the RMS value of said A.C. voltages which actuate the segments of said display device.

3. The method according to claim 1, wherein said keyboard is a matrix keyboard having a set of column conductors and a set of row conductors, and wherein said first subset of said display conductors are coupled to said column conductors and said second subset of said display conductors are coupled to said row conductors.

4. The method according to claim 3, wherein the step of communicating A.C. voltages on said second subset of said display conductors includes providing periods when said voltages float, said periods occurring simultaneously with the occurrence of said keyboard scanning pulses.

5. In a display actuation and keyboard scanning circuit comprising a display device having a set of display conductors and a keyboard having a set of scanning conductors selectively connectable to a set of sensing conductors in response to the operation of said keyboard, a method for actuating said display device and simultaneously scanning said keyboard, said method comprising the steps of:
(a) connecting each of said set of scanning conductors to a respective one of a first subset of said display conductors;
(b) connecting each of said set of sensing conductors to a respective one of a second subset of said display conductors;
(c) communicating display actuation signals to said display device via said set of display conductors;
(d) superimposing keyboard scanning pulses upon the display actuation signals applied to the display conductors comprising said first subset; and
(e) sensing the occurrence of said keyboard scanning pulses on the display conductors comprising said second subset in response to operation of said keyboard.

6. The method according to claim 5, wherein said keyboard has a set of column conductors comprising said set of scanning conductors and a set of row conductors comprising said set of sensing conductors.

* * * * *